(12) United States Patent
Hibi et al.

(10) Patent No.: US 7,290,865 B2
(45) Date of Patent: *Nov. 6, 2007

(54) INKJET HEAD

(75) Inventors: Manabu Hibi, Nagoya (JP); Atsuo Sakaida, Gifi (JP)

(73) Assignee: Brother Kogyo Kabushiki Kaisha, Nagoya (JP)

( * ) Notice: Subject to any disclaimer, the term of this patent is extended or adjusted under 35 U.S.C. 154(b) by 144 days.

This patent is subject to a terminal disclaimer.

(21) Appl. No.: 10/917,416

(22) Filed: Aug. 13, 2004

(65) Prior Publication Data

US 2005/0068375 A1 Mar. 31, 2005

Related U.S. Application Data

(63) Continuation-in-part of application No. 10/367,716, filed on Feb. 19, 2003, now Pat. No. 7,008,048.

(30) Foreign Application Priority Data

Feb. 19, 2002 (JP) ............... 2002-041312
Aug. 14, 2003 (JP) ............... 2003-293326

(51) Int. Cl.
*B41J 2/045* (2006.01)

(52) U.S. Cl. ....................................... 347/68

(58) Field of Classification Search ............. 347/68–72
See application file for complete search history.

(56) References Cited

U.S. PATENT DOCUMENTS

| | | | |
|---|---|---|---|
| 4,680,595 A | 7/1987 | Cruz-Uribe et al. | |
| 5,087,930 A | 2/1992 | Roy et al. | |
| 5,128,694 A * | 7/1992 | Kanayama | 347/72 |
| 5,402,159 A | 3/1995 | Takahashi et al. | |
| 5,757,400 A | 5/1998 | Hoisington | |
| 5,912,526 A | 6/1999 | Okawa et al. | |
| 6,174,051 B1 * | 1/2001 | Sakaida | 347/72 |
| 6,331,045 B1 | 12/2001 | Harvey et al. | |
| 6,431,691 B1 * | 8/2002 | Tanikawa et al. | 347/70 |
| 6,488,355 B2 | 12/2002 | Nakamura et al. | |
| 6,695,437 B2 | 2/2004 | Nakamura et al. | |
| 7,008,048 B2 * | 3/2006 | Sakaida | 347/68 |

FOREIGN PATENT DOCUMENTS

| | | |
|---|---|---|
| EP | 0 721 839 A2 | 7/1996 |
| JP | A-4-341852 | 11/1992 |
| JP | A-9-323409 | 12/1997 |
| JP | A-11-138796 | 5/1999 |
| JP | A-2001-334661 | 12/2001 |
| JP | A-2003-39673 | 2/2003 |
| JP | A-2003-165215 | 6/2003 |

* cited by examiner

*Primary Examiner*—An H. Do
(74) *Attorney, Agent, or Firm*—Oliff & Berridge, PLC (57) ABSTRACT

Individual electrodes each substantially shaped like a parallelogram are arranged on a piezoelectric sheet in an actuator unit. A land portion is electrically connected to one of acute-angled portions of each individual electrode. Each land portion is disposed between other two adjacent individual electrodes. A C-shaped groove portion is formed around each land portion so as to pierce the piezoelectric sheet along the outer shape of the land portion.

11 Claims, 11 Drawing Sheets

INKJET HEAD

CROSS REFERENCE TO RELATED APPLICATIONS

This application is a continuation-in-part of patent application Ser. No. 10/367,716 filed on Feb. 19, 2003, now U.S. Pat. No. 7,008,048 issued on Mar. 7, 2006.

BACKGROUND OF THE INVENTION

1. Field of the Invention

The present invention relates to an inkjet head for ejecting ink onto a recording medium to perform printing.

2. Description of the Related Art

An inkjet head is used in an inkjet printer or the like so that pulse-like pressure is selectively applied to each of pressure chambers supplied with ink from an ink tank to thereby eject ink from a nozzle connected to the selected pressure chamber. An actuator unit which is a laminate of piezoelectric sheets made of piezoelectric ceramics may be used as means for applying pressure to each pressure chamber selectively.

As an example of this type inkjet head, there is known an inkjet head including an actuator unit which has a laminate of continuous planar piezoelectric sheets laid over pressure chambers so that at least one of the piezoelectric sheets is put between a common electrode disposed so as to be common to all the pressure chambers and kept at ground potential and a large number of individual electrodes (i.e. drive electrodes) disposed in positions opposite to the pressure chambers respectively (Please see JP-A-4-341852 (FIG. 1) and U.S. Pat. No. 5,402,159). The portion of the piezoelectric sheet sandwiched between the common electrode and the individual electrodes and polarized in a direction of lamination shrinks and expands in the direction of lamination by a so-called longitudinal piezoelectric effect when an external electric field is applied in a direction of polarization of the piezoelectric sheet in the condition that individual electrodes located on opposite sides of the sandwiched portion are set so as to be different in electric potential from the common electrode. In this case, the portion of the piezoelectric sheet sandwiched between the common electrode and the individual electrodes serves as an active layer capable of being deformed by the piezoelectric effect when an external electric field is applied. As a result, the volume of a corresponding pressure chamber is changed so that ink can be ejected from a nozzle connected to the pressure chamber toward a recording medium.

SUMMARY OF THE INVENTION

In the aforementioned inkjet head, so-called structural crosstalk has become an issue of discussion in recent years. That is, as pressure chambers are arranged densely to satisfy the recent requirement of high-resolution image and high-speed printing, portions of the piezoelectric sheet opposite to pressure chambers adjacent to a certain pressure chamber are deformed due to the deformation of an active layer opposite to the certain pressure chamber so that ink may be ejected from ink ejection holes originally unnecessary for ink ejection or the amount of ink ejected from the necessary ink ejection holes may increase or decrease. Particularly, lands formed so as to extend from the individual electrodes respectively and each serving as a portion into which a voltage applied to each individual electrode is input have been not regarded as a cause of crosstalk until now because the lands do not drive the pressure chambers directly. The present inventor of the invention however has found that there is a possibility that the land portions will be a cause of crosstalk because the land portions deform portions of the piezoelectric sheet around the land portions. In addition, an actuator unit under a land portion (as terminal region) is attached to cavity plate so that deformation caused by the actuator unit under the land portion appears especially in an actuator unit adjacent to or around the land portion (as terminal region). Moreover, the inventor has ascertained that the influence of the land portions is too large to be ignored because each of the land portions is disposed nearer to adjacent pressure chambers than to the individual electrode corresponding to the land portion. When such structural crosstalk occurs, the quality of a printed image deteriorates. Accordingly, reduction in structural crosstalk is a very important issue for improving the quality of the inkjet printer.

It is an object of the invention to provide an inkjet head in which structural crosstalk can be reduced by forming grooves around terminal region.

According to one aspect of the invention, an inkjet head having: a flow path unit including pressure chambers arranged adjacently to one another in the form of a matrix along a plane and connected to nozzles respectively; and an actuator unit fixed to a surface of the flow path unit for changing the volume of each of the pressure chambers, wherein the actuator unit includes: individual electrodes having electrode regions arranged in positions opposite to the pressure chambers respectively, and terminal regions which are connected to the electrode regions and to which signal lines are connected; a common electrode provided so as to be laid over the pressure chambers; at least one piezoelectric sheet put between the common electrode and the individual electrodes; and grooves formed around the terminal regions respectively.

According to another aspect of the invention, structural crosstalk can be reduced because the grooves are formed around the terminal regions respectively so that distortion of a portion of the piezoelectric sheet opposite to the terminal region of a certain pressure chamber is hardly transmitted to portions of the piezoelectric sheet opposite to other pressure chambers. As a result, the volume and speed of an ejected ink droplet can be made uniform.

According to another aspect of the invention, the grooves are provided only around the terminal regions. According to this configuration, the distance of each groove formed can be shortened. As a result, structural crosstalk can be reduced. Moreover, reduction in the cost for forming the grooves can be attained while reduction in rigidity of the actuator unit can be suppressed.

According to another aspect of the invention, each of the pressure chambers may be shaped like a parallelogram having two acute-angled portions or like a parallelogram having rounded corner portions in plan view so that corresponding one of the terminal regions is located near one of the two acute-angled portions of the pressure chamber and between the electrode regions of other two adjacent individual electrodes. According to this configuration, structural crosstalk can be reduced even in the case where the pressure chambers are disposed densely.

According to another aspect of the invention, the grooves may be formed so as to pierce the at least one piezoelectric sheet put between the common electrode and the individual electrodes. According to this configuration, structural crosstalk can be reduced effectively because a region of the piezoelectric sheet corresponding to the terminal region of a certain individual electrode serving as an active layer is not directly continuous between adjacent individual electrodes and pressure chambers.

According to another aspect of the invention, the grooves may be formed along outer shapes of the terminal regions respectively. According to this configuration, the distance of each groove formed can be shortened. As a result, reduction in the cost for forming the grooves can be attained more greatly while reduction in rigidity of the actuator unit can be suppressed more greatly.

According to another aspect of the invention, the individual electrodes may further have connection regions for connecting the electrode regions to the terminal regions respectively while the grooves are formed continuously on the nearly whole circumferences of the terminal regions except portions facing the connection regions respectively. According to this configuration, structural crosstalk can be reduced in almost all directions around the terminal regions.

According to another aspect of the invention, the grooves may be provided so that a plurality of grooves is formed around each terminal region. According to this configuration, structural crosstalk can be reduced efficiently because the plurality of grooves are formed in accordance with the shape of each pressure chamber and the position of arrangement of each terminal region.

According to another aspect of the invention, the grooves may be provided so that two of the grooves are formed around the terminal region of a corresponding individual electrode so as to be symmetrical to each other with respect to a line connecting the electrode region and the terminal region of the corresponding individual electrode to each other. According to this configuration, when structural crosstalk is relatively small in a direction of a line connecting the electrode region and the terminal region to each other, reduction in the cost for forming the grooves can be attained while structural crosstalk can be reduced in other directions than the direction.

According to another aspect of the invention, the grooves may be formed in positions crossing virtual lines connecting the terminal regions of the individual electrodes to the electrode regions of adjacent individual electrodes respectively at the shortest distance. According to this configuration, structural crosstalk can be reduced effectively because a portion from which vibration is most easily transmitted to adjacent individual electrodes can be suppressed.

According to another aspect of the invention, preferably, the terminal region of each individual electrode is disposed opposite to girder portions serving as partition walls for forming adjacent pressure chambers. According to this configuration, the terminal regions are not disposed in drive portions of the actuator unit. As a result, the drive of the actuator unit can be prevented from being disturbed.

According to another aspect of the invention, the grooves are formed at the terminal portion corresponding to adjacent pressure chambers where deformation can be easily occurred, so that manufacturing cost of the grooves can be reduced.

BRIEF DESCRIPTION OF THE DRAWINGS

These and other objects and advantages of this invention will become more fully apparent from the following detailed description taken with the accompanying drawings in which.

DESCRIPTION OF THE PREFERRED EMBODIMENTS

A first embodiment of the invention will be described below with reference to the drawings.

Figure 1:
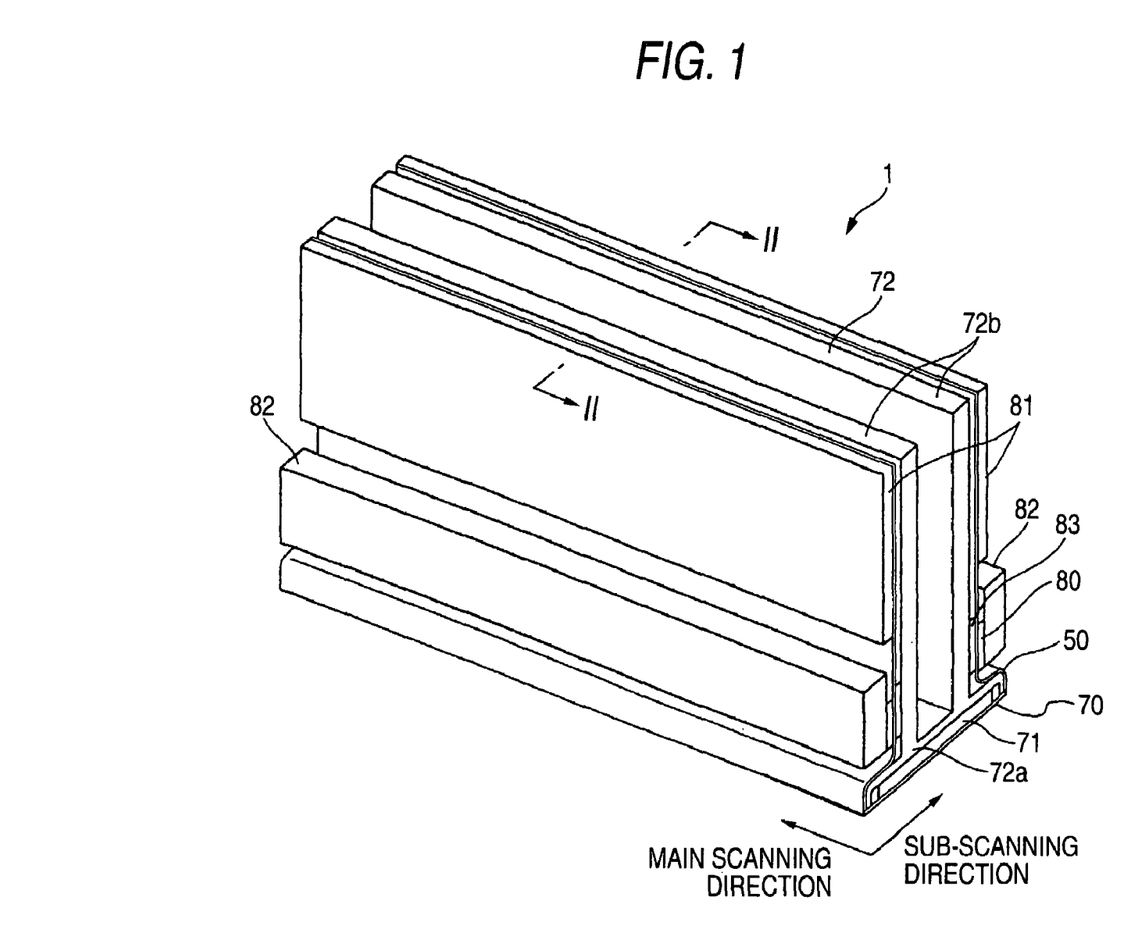
FIG. 1 is a perspective view of an inkjet head according to a first embodiment of the invention.
Figure 2:
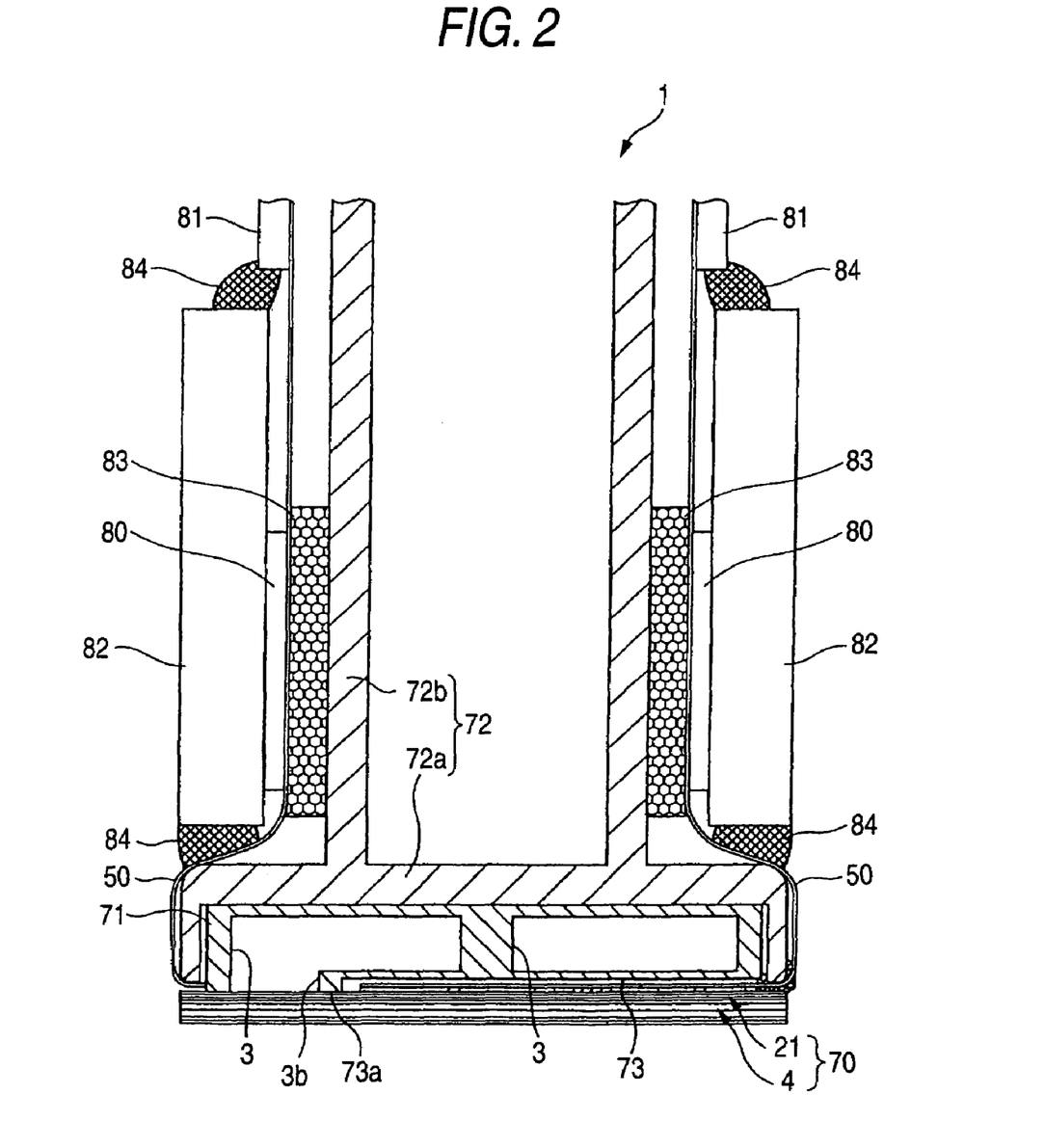
FIG. 2 is a sectional view taken along the line II-II in FIG. 1.

FIG. 1 is a perspective view showing the external appearance of an inkjet head according to the first embodiment. FIG. 2 is a sectional view taken along the line II-II in FIG. 1. As shown in FIG. 1, an inkjet head 1 according to this embodiment has a head body 70, and a base block 71. The head body 70 extends in a main scanning direction so as to be shaped like a rectangle in plan view for ejecting ink onto a sheet of paper. The base block 71 is disposed above the head body 70 and includes two ink reservoirs 3 which are flow paths of ink supplied to the head body 70.

The head body 70 includes a flow path unit 4, and a plurality of actuator units 21. Ink flow paths are formed in the flow path unit 4. The plurality of actuator units 21 is bonded onto an upper surface of the flow path unit 4. The flow path unit 4 and actuator units 21 are formed in such a manner that a plurality of thin plates are laminated and bonded to one another. The actuator units 21 are provided with flexible printed circuit boards 50 (hereinafter referred to as FPC boards) which are feeder circuit members. The FPC boards 50 are led out to the left and right. As will be described later, the FPC boards 50 are formed in such a manner that two FPC boards (see FIG. 8 and FIGS. 9A and 9B) are led out to the left and right while partially overlapping each other. For example, the base block 71 is made of a metal material such as stainless steel. Each of the ink reservoirs 3 in the base block 71 is a nearly rectangular parallelepiped hollow region formed along a direction of the length of the base block 71.

A lower surface 73 of the base block 71 protrudes downward from its surroundings in neighbors of openings 3b. The base block 71 touches the flow path unit 4 only at neighbors 73a of the openings 3b of the lower surface 73. For this reason, all other regions than the neighbors 73a of the openings 3b of the lower surface 73 of the base block 71 are isolated from the head body 70 so that the actuator units 21 are disposed in the isolated portions.

The base block 71 is bonded and fixed into a groove formed in a lower surface of a grip 72a of a holder 72. The holder 72 includes the grip 72a, and a pair of flat plate-like protrusions 72b extending from an upper surface of the grip 72a in a direction perpendicular to the upper surface of the grip 72a so as to form a predetermined distance between each other. The FPC boards 50 attached to the actuator units 21 are disposed so as to go along surfaces of the protrusions 72b of the holder 72 through elastic members 83 such as sponges respectively. Driver ICs 80 are disposed on the FPC boards 50 disposed on the surfaces of the protrusions 72b of the holder 72. As will be described later, the FPC boards 50 are electrically connected to the driver ICs 80 and electrodes 34 and 35 (see FIGS. 9A and 9B) of the actuator units 21 by soldering so that drive signals output from the driver ICs 80 are transmitted to the actuator units 21 of the head body 70.

Nearly rectangular parallelepiped heat sinks 82 are disposed closely on outer surfaces of the driver ICs 80, so that heat generated in the driver ICs 80 can be radiated efficiently. Boards 81 are disposed above the driver ICs 80 and the heat sinks 82 and outside the FPC boards 50. An upper surface of each heat sink 82 and a corresponding board 81 are bonded to each other by a seal member 84. Similarly, a lower surface of each heat sink 82 and a corresponding FPC board 50 are bonded to each other by a seal member 84.

Figure 3:
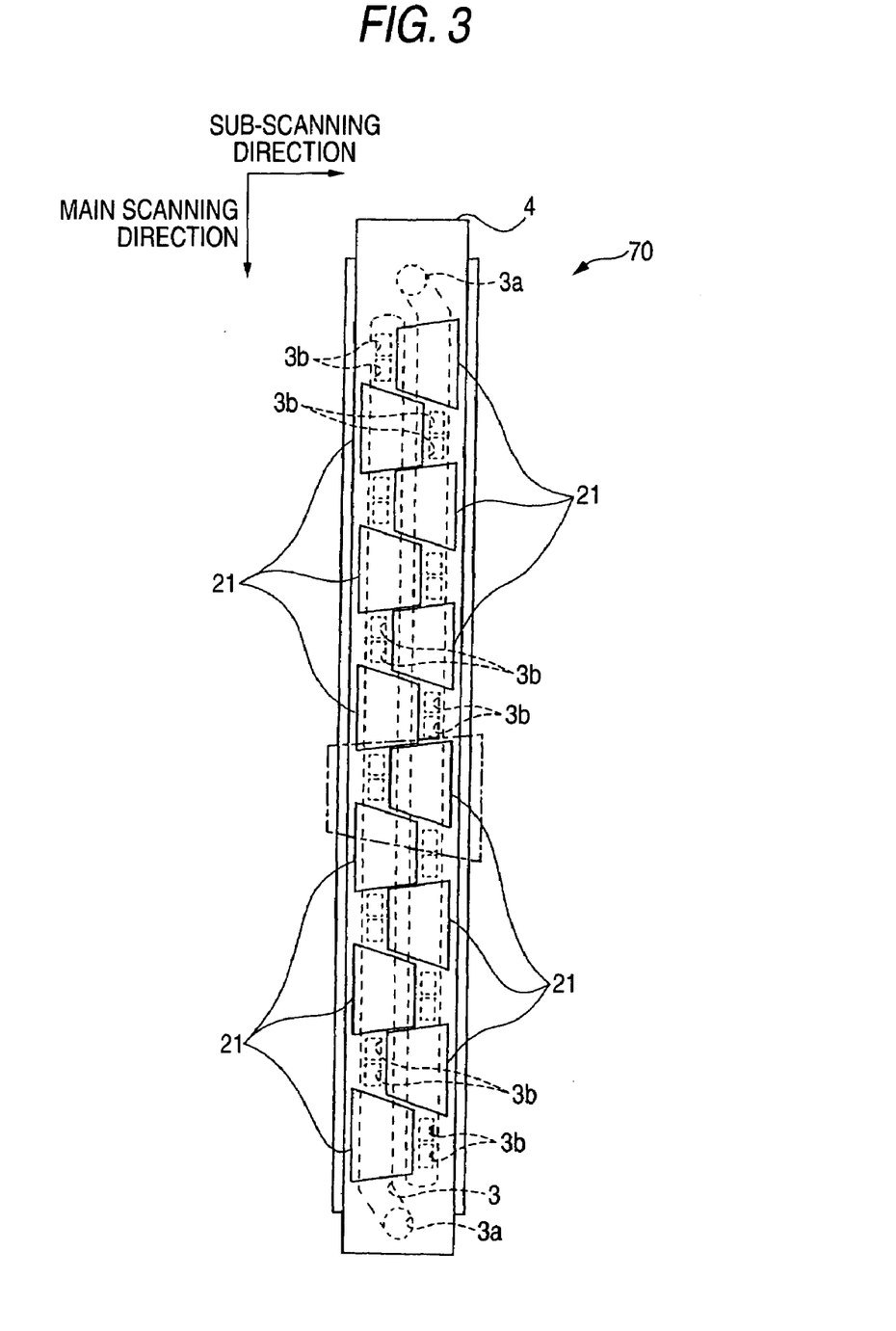
FIG. 3 is a plan view of a head body included in the inkjet head depicted in FIG. 2.

FIG. 3 is a plan view of the head body 70 depicted in FIG. 1. In FIG. 3, the ink reservoirs 3 formed in the base block 71 are drawn virtually by the broken line. The two ink reservoirs 3 extend in parallel to each other along a direction of the length of the head body 70 so as to form a predetermined distance between the two ink reservoirs 3. Each of the two ink reservoirs 3 has an opening 3a at its one end. The two ink reservoirs 3 communicate with an ink tank (not shown) through the openings 3a so as to be always filled with ink. A large number of openings 3b are provided in each ink reservoir 3 along the direction of the length of the head body 70. As described above, the ink reservoirs 3 are connected to the flow path unit 4 by the openings 3b. The large number of openings 3b is formed in such a manner that each pair of openings 3b are disposed closely along the direction of the length of the head body 70. The pairs of openings 3b connected to one ink reservoir 3 and the pairs of openings 3b connected to the other ink reservoir 3 are disposed in zigzag.

The plurality of actuator units 21 (which mainly mean portions except the FPC boards 50 in the following description of the flow path unit 4) each shaped like a trapezoid in plan view are disposed in regions where the openings 3b are not provided. The plurality of actuator units 21 are disposed in zigzag so as to have a pattern reverse to that of the pairs of openings 3b. Parallel opposed sides (upper and lower sides) of each actuator unit 21 are parallel to the direction of the length of the head body 70. Inclined sides of adjacent actuator units 21 partially overlap each other in a direction of the width of the head body 70.

Figure 4:
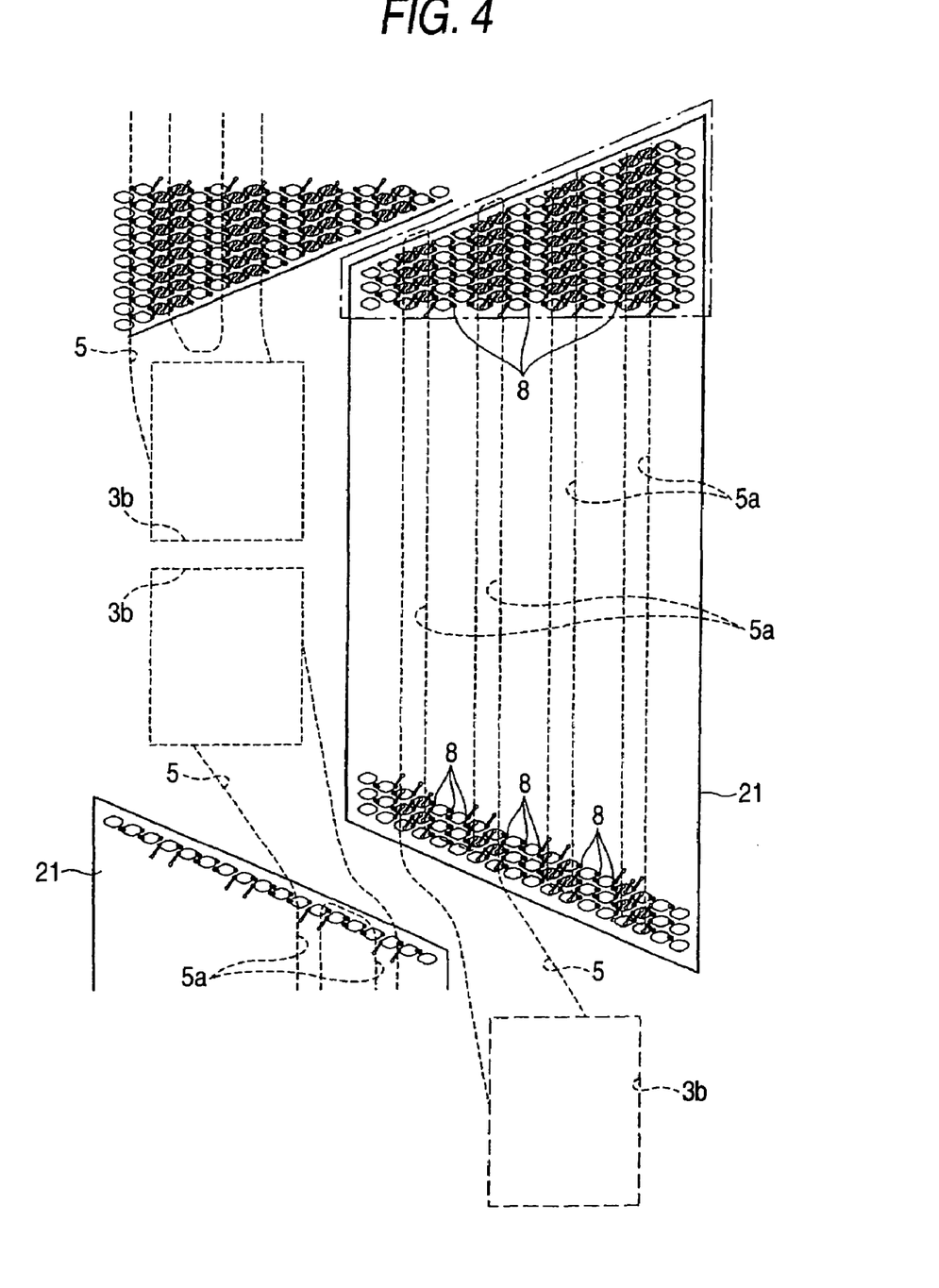
FIG. 4 is an enlarged view of a region surrounded by the chain line in FIG. 3.

FIG. 4 is an enlarged view of a region surrounded by the chain line in FIG. 3. As shown in FIG. 4, the openings 3b provided in each ink reservoir 3 communicate with manifolds 5 which are common ink chambers respectively. An end portion of each manifold 5 branches into two sub manifolds 5a. In plan view, every two sub manifolds 5a separated from adjacent openings 3b extend from two inclined sides of each actuator unit 21. That is, four sub manifolds 5a in total are provided below each actuator unit 21 and extend along the parallel opposed sides of the actuator unit 21 so as to be separated from one another.

Ink ejection regions are formed in a lower surface of the flow path unit 4 corresponding to the bonding regions of the actuator units 21. As will be described later, a large number of nozzles 8 are disposed in the form of a matrix in a surface of each ink ejection region. Although FIG. 4 shows several nozzles 8 for the sake of simplification, nozzles 8 are actually disposed on the whole of the ink ejection region.

Figure 5:
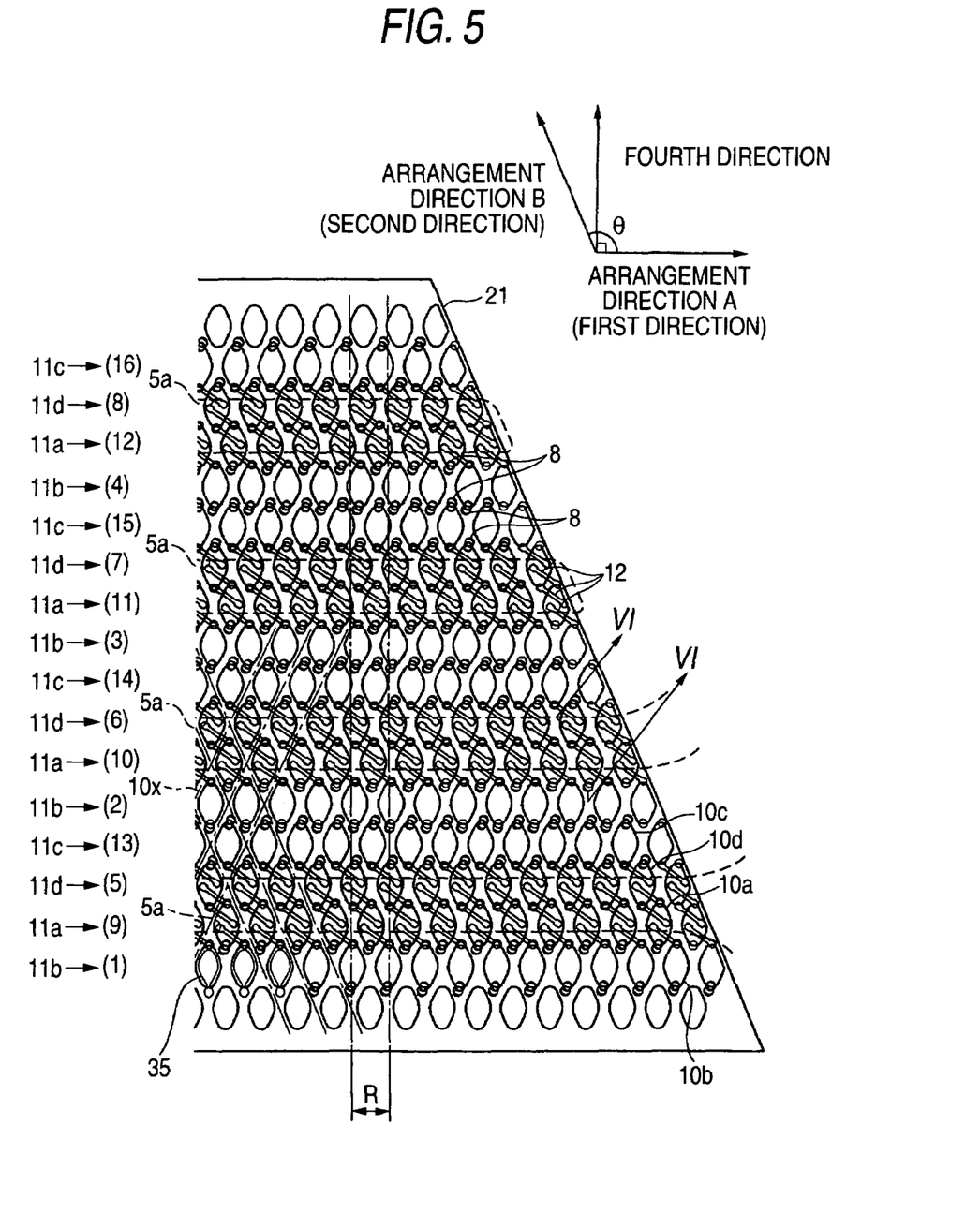
FIG. 5 is an enlarged view of a region surrounded by the chain line in FIG. 4.

FIG. 5 is an enlarged view of a region surrounded by the chain line in FIG. 4. FIGS. 4 and 5 show a state in which a plane of a large number of pressure chambers 10 disposed in the form of a matrix in the flow path unit 4 is viewed from a direction perpendicular to the ink ejection surface. Each of the pressure chambers 10 is substantially shaped like a rhomboid having rounded corners in plan view. The long diagonal line of the rhomboid is parallel to the direction of the width of the flow path unit 4. Each pressure chamber 10 has one end connected to a corresponding nozzle 8, and the other end connected to a corresponding sub manifold 5a as a common ink path through an aperture 12 (see FIG. 6). An individual electrode 35 having a planar shape similar to but smaller by a size than each pressure chamber 10 is formed on the actuator unit 21 so as to be located in a position where the individual electrode 35 overlaps the pressure chamber 10 in plan view. Some of a large number of individual electrodes 35 are shown in FIG. 5 for the sake of simplification. Incidentally, the pressure chambers 10, apertures 12, etc. that must be expressed by the broken line in the actuator units 21 or in the flow path unit 4 are expressed by the solid line in FIGS. 4 and 5 to make it easy to understand the drawings.

In FIG. 5, a plurality of virtual rhombic regions 10x in which the pressure chambers 10 (10a, 10b, 10c and 10d) are stored respectively are disposed adjacently in the form of a matrix both in an arrangement direction A (first direction) and in an arrangement direction B (second direction) so that adjacent virtual rhombic regions 10x have common sides not overlapping each other. The arrangement direction A is a direction of the length of the inkjet head 1, that is, a direction of extension of each submanifold 5a. The arrangement direction A is parallel to the short diagonal line of each rhombic region 10x. The arrangement direction B is a direction of one inclined side of each rhombic region 10x so that an obtuse angle . is formed between the arrangement direction B and the arrangement direction A. The central position of each pressure chamber 10 is common to that of a corresponding rhombic region 10x but the contour line of each pressure chamber 10 is separated from that of a corresponding rhombic region 10x in plan view.

The pressure chambers 10 disposed adjacently in the form of a matrix in the two directions, that is, in the arrangement directions A and B are formed at intervals of a distance corresponding to 37.5 dpi along the arrangement direction A. The pressure chambers 10 are formed so that eighteen pressure chambers are arranged in the arrangement direction B in one ink ejection region. Pressure chambers located at opposite ends in the arrangement direction B are dummy chambers that do not contribute to ink jetting.

The plurality of pressure chambers 10 disposed in the form of a matrix form a plurality of pressure chamber columns along the arrangement direction A shown in FIG. 5. The pressure chamber columns are separated into first pressure chamber columns 11a, second pressure chamber columns 11b, third pressure chamber columns 11c and fourth pressure chamber columns 11d in accordance with positions relative to the sub manifolds 5a viewed from a direction (third direction) perpendicular to the paper of FIG. 5. The first to fourth pressure chamber columns 11a to 11d are arranged cyclically in order of 11c . 11d . 11a . 11b . 11c . 11d . . . . . 11b from an upper side to a lower side of each actuator unit 21.

In pressure chambers 10a forming a first pressure chamber column 11a and pressure chambers 10b forming a second pressure chamber column 11b, nozzles 8 are unevenly distributed on a lower side of the paper of FIG. 5 in a direction (fourth direction) perpendicular to the arrangement direction A when viewed from the third direction. The nozzles 8 are located in lower end portions of corresponding rhombic regions 10x respectively. On the other hand, in pressure chambers 10c forming a third pressure chamber column 11c and pressure chambers 10d forming a fourth pressure chamber column 11d, nozzles 8 are unevenly distributed on an upper side of the paper of FIG. 5 in the fourth direction. The nozzles 8 are located in upper end portions of corresponding rhombic regions 10x respectively. In the first and fourth pressure chamber columns 11a and 11d, regions not smaller than half of the pressure chambers 10a and 10d overlap the sub manifolds 5a when viewed from the third direction. In the second and third pressure chamber columns 11b and 11c, all the regions of the pressure chambers 10b and 10c do not overlap the sub manifolds 5a at all when viewed from the third direction. For this reason, pressure chambers 10 belonging to any pressure chamber column can be formed so that the sub manifolds 5a are widened as sufficiently as possible while nozzles 8 connected to the pressure chambers 10 do not overlap the sub manifolds 5a. Accordingly, ink can be supplied to there respective pressure chambers 10 smoothly.

Figure 6:
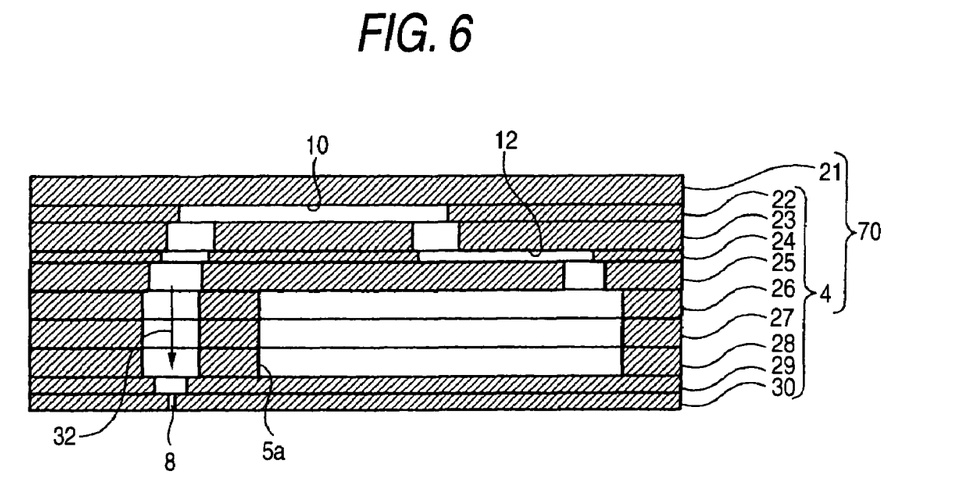
FIG. 6 is a sectional view taken along the line VI-VI in FIG. 5.
Figure 7:
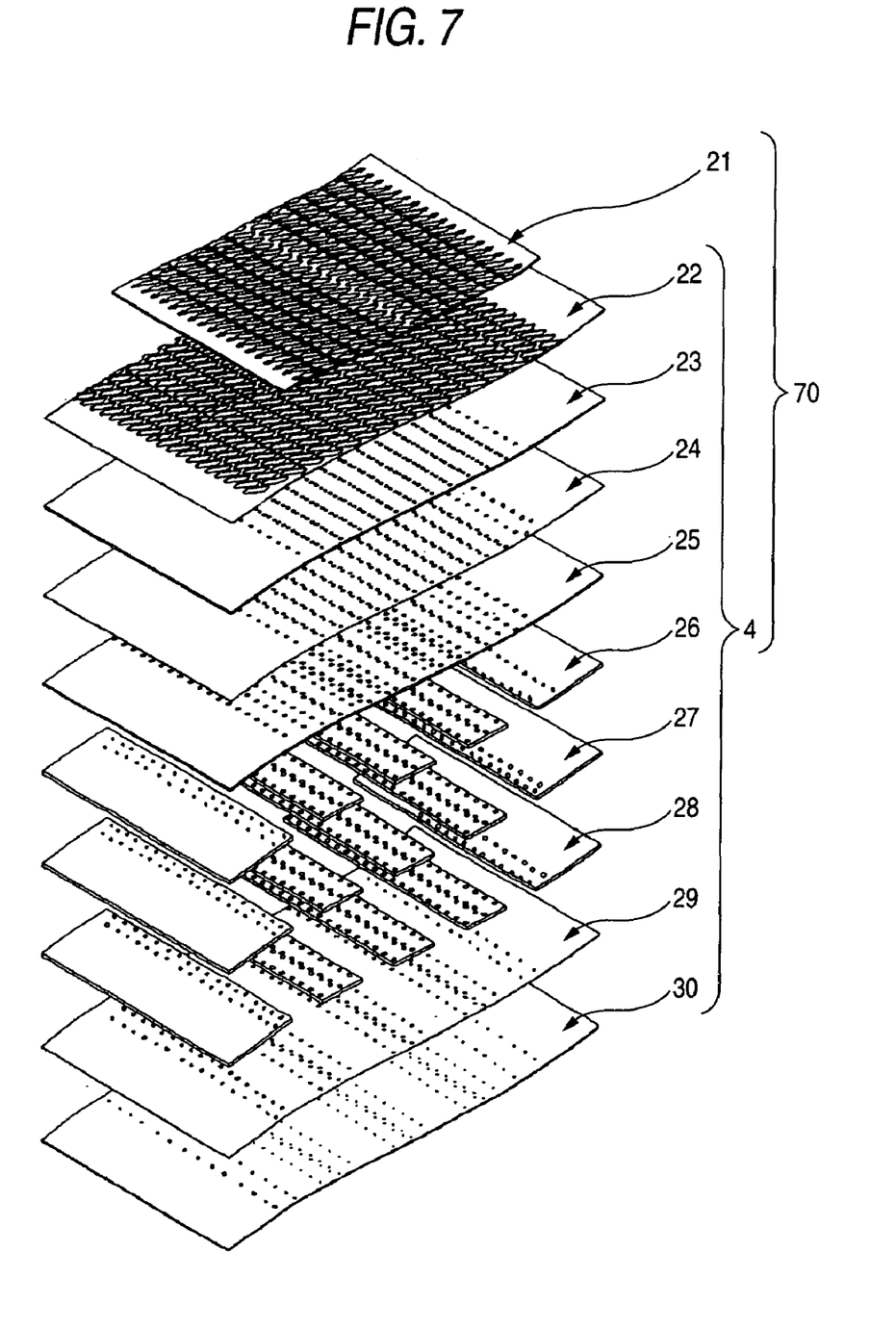
FIG. 7 is an exploded perspective view showing part of the head body depicted in FIG. 4.

Next, the sectional structure of the head body 70 will be further described with reference to FIGS. 6 and 7. FIG. 6 is a sectional view taken along the line VI-VI in FIG. 5 and showing a pressure chamber 10a belonging to a first pressure chamber column 11a. FIG. 7 is an exploded perspective view showing part of the head body. As shown in FIG. 6, each nozzle 8 communicates with a sub manifold 5a through a pressure chamber 10 (10a or 10b) and an aperture 12. In this manner, individual ink flow paths 32 are formed in the head body 70 in accordance with the pressure chambers 10 so that each individual ink flow path 32 extends from an outlet of the sub manifold 5a to the nozzle 8 through the aperture 12 and the pressure chamber 10.

As shown in FIG. 7, the head body 70 has a laminated structure in which ten sheet members in total, namely, an actuator unit 21 (except FPC boards 50), a cavity plate 22, a base plate 23, an aperture plate 24, a supply plate 25, manifold plates 26, 27 and 28, a cover plate 29 and a nozzle plate 30 are laminated on one another in descending order. The ten sheet members except the actuator unit 21, that is, nine sheet plates form the flow path unit 4.

As will be described later in detail, the actuator unit 21 includes a laminate of four piezoelectric sheets 41 to 45 (see FIG. 9) as four layers, and electrodes disposed so that three layers of the four layers are provided as layers having portions serving as active layers at the time of application of electric field (hereinafter referred to as "active layer-including layers" simply) while the residual three layers are provided as non-active layers. The cavity plate 22 is a metal plate having a large number of nearly rhomboid openings corresponding to the pressure chambers 10. The base plate 23 is a metal plate which has holes each for connecting one pressure chamber 10 of the cavity plate 22 to a corresponding aperture 12, and holes each for connecting the pressure chamber 10 to a corresponding nozzle 8. The aperture plate 24 is a metal plate which has apertures 12, and holes each for connecting one pressure chamber 10 of the cavity plate 22 to a corresponding nozzle 8. Each aperture 12 is composed of two holes, and a half-etched region for connecting the two holes to each other. The supply plate 25 is a metal plate which has holes each for connecting an aperture 12 for one pressure chamber 10 of the cavity plate 22 to a corresponding sub manifold 5a, and holes each for connecting the pressure chamber 10 to a corresponding nozzle 8. The manifold plates 26, 27 and 28 are metal plates which have the sub manifolds 5a configured by the manifold plates when laminated, and holes each for connecting one pressure chamber 10 of the cavity plate 22 to a corresponding nozzle 8. The cover plate 29 is a metal plate which has holes each for connecting one pressure chamber 10 of the cavity plate 22 to a corresponding nozzle 8. The nozzle plate 30 is a metal plate which has nozzles 8 each provided for one pressure chamber 10 of the cavity plate 22.

The nine sheets 21 to 30 are laminated on one another while positioned so that ink flow paths 32 are formed as shown in FIG. 6. Each ink flow path 32 first goes upward from the sub manifold 5a, extends horizontally in the aperture 12, goes further upward from the aperture 12, extends horizontally again in the pressure chamber 10, goes obliquely downward in the direction of departing from the aperture 12 for a while and goes vertically downward to the nozzle 8.

Figure 8:
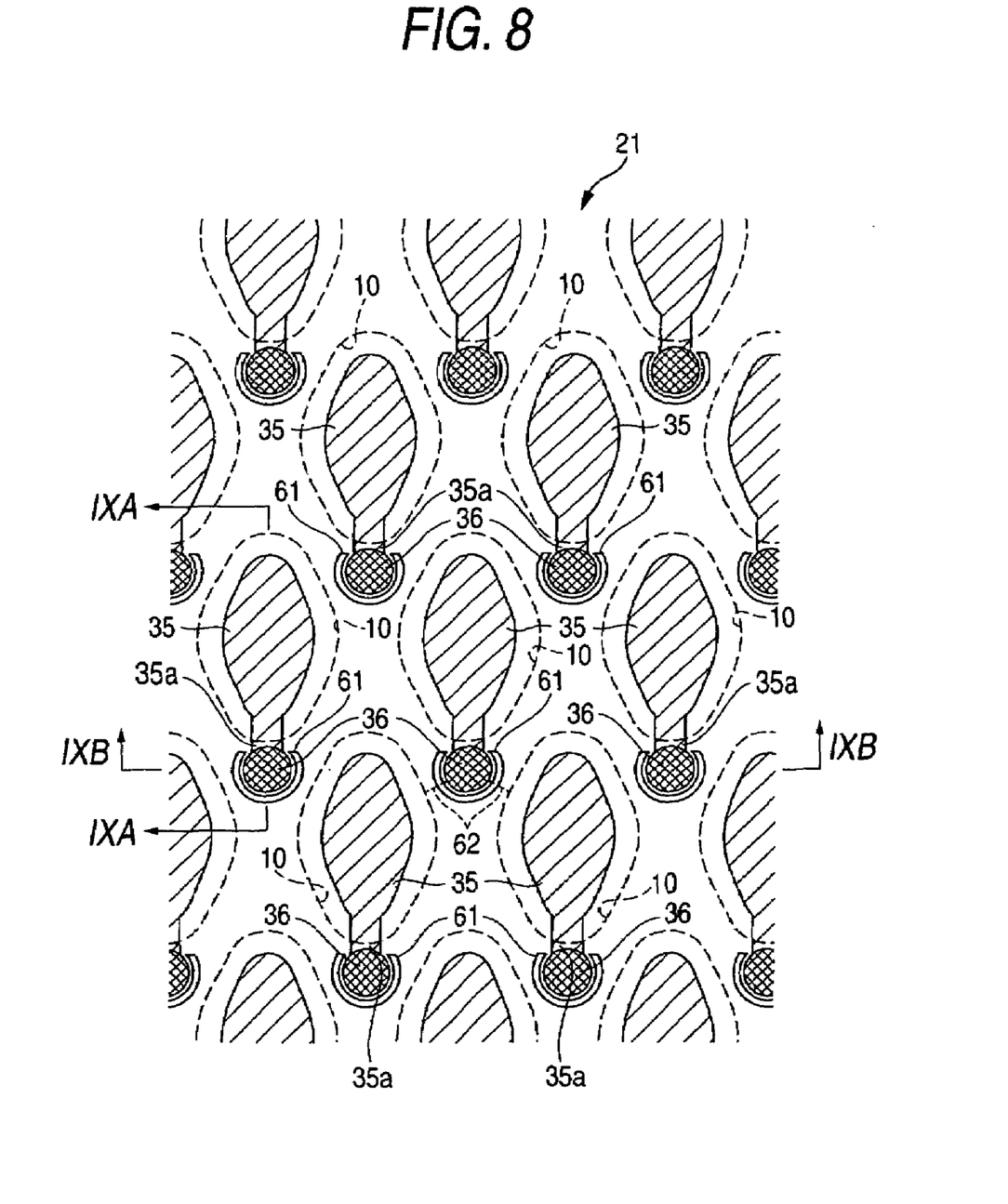
FIG. 8 is an enlarged plan view of an actuator unit depicted in FIG. 5.
Figure 9A:
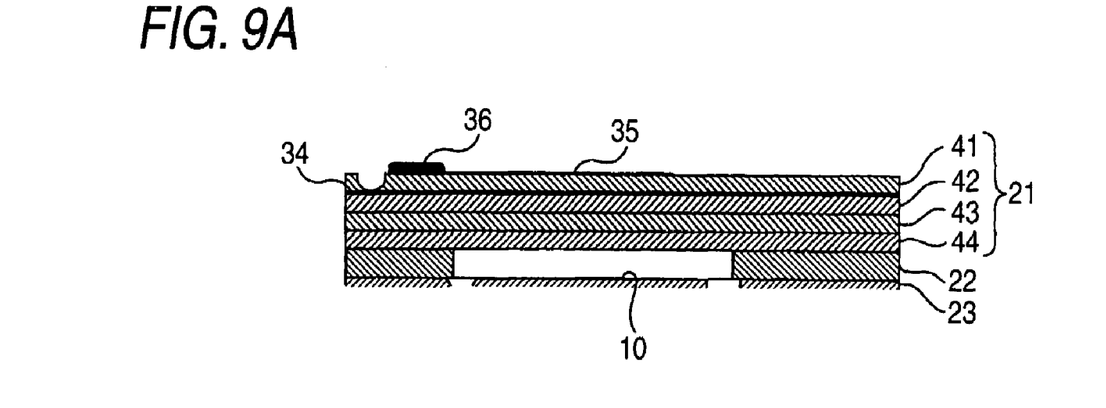
FIGS. 9A and 9B are partial sectional views showing the actuator unit depicted in FIG. 8.
Figure 9B:
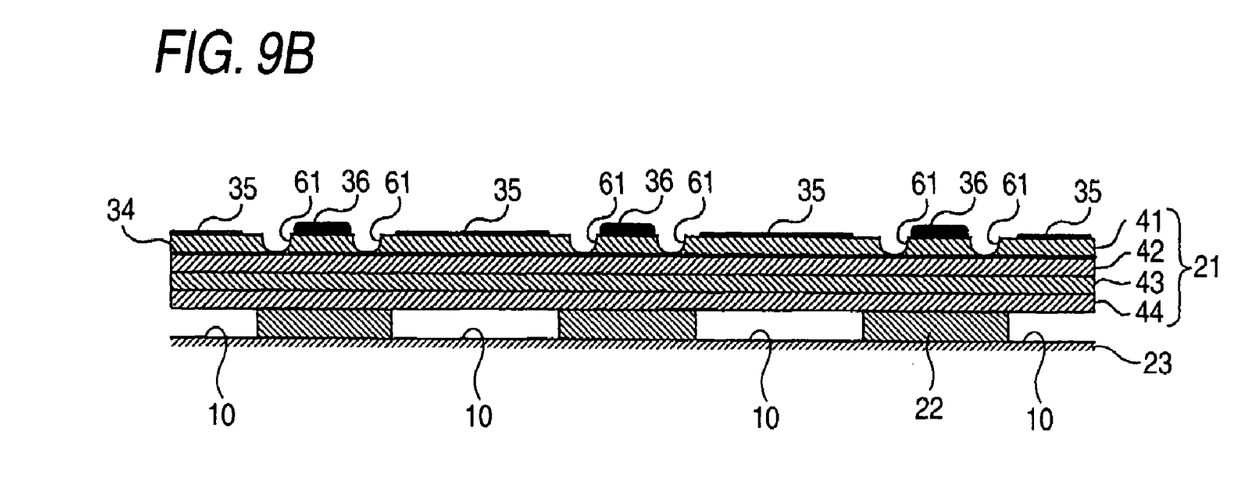

Next, the detailed structure of the actuator unit 21 laminated on the cavity plate 22 as the uppermost layer of the flow path unit 4 will be described. FIG. 8 is an enlarged plan view of the upper surface side of the actuator unit 21. FIG. 9A is a sectional view taken along the line IXA-IXA in FIG. 8 and showing part of the actuator unit 21. FIG. 9B is a sectional view taken along the line IXB-IXB in FIG. 8 and showing part of the actuator unit 21.

As shown in FIG. 9A, the actuator unit 21 includes four piezoelectric sheets 41 to 44 formed to have a thickness of about 15 .m equally. The piezoelectric sheets 41 to 44 are provided as stratified flat plates (continuous flat plate layers) which are continued to one another so as to be arranged over a large number of pressure chambers 10 formed in one ink ejection region in the head body 70. Because the piezoelectric sheets 41 to 44 are arranged as continuous flat plate layers over the large number of pressure chambers 10, the individual electrodes 35 can be disposed densely on the piezoelectric sheet 41 when, for example, a screen printing technique is used. Accordingly, the pressure chambers 10 formed in positions opposite to the individual electrodes 35 can be also disposed densely, so that a high-resolution image can be printed. Each of the piezoelectric sheets 41 to 44 is made of a ceramic material of the lead zirconate titanate (PZT) type having ferroelectricity.

The individual electrodes 35 are formed on the piezoelectric sheet 41 as the uppermost layer. A common electrode 34 having a thickness of about 2 .m is interposed between the piezoelectric sheet 41 as the uppermost layer and the piezoelectric sheet 42 located under the piezoelectric sheet 41 so that the common electrode 34 is formed on the whole surface of the piezoelectric sheet 42. The individual electrodes 35 and the common electrode 34 are made of a metal material such as Ag-Pd.

As shown in FIG. 8, each individual electrode 35 has a nearly rhomboid (parallelogrammatic) planar shape (electrode region) having a thickness of about 1 μm and nearly similar to the shape of the pressure camber 10. The individual electrodes 35 are arranged in the form of a matrix (see FIG. 5). One of acute-angled portions of each nearly rhomboid individual electrode 35 extends in a direction (downward in FIG. 8). A circular land portion 36 (terminal region) having a diameter of about 160 μm is provided at an end region of the extension so as to be electrically connected to the individual electrode 35. For example, each land portion 36 is made of gold containing glass frit. The land portions 36 are bonded onto surfaces of the extension portions in the individual electrodes 35 respectively. The land portions 36 are also electrically connected to contact points provided on the FPC 50, respectively. As shown in FIGS. 9A and 9B, the land portions 36 are arranged so as to be not opposite to the pressure chambers 10 but opposite to the partition walls 22 (girder portions) for forming the pressure chambers 10. Incidentally, each individual electrode 35 further includes a connection region 35a formed as a region not opposite to the pressure chamber 10 but provided for connecting the electrode region and the terminal region to each other.

The common electrode 34 is grounded at a region not shown. Accordingly, the common electrode 34 is kept at ground potential equally in regions opposite to all the pressure chambers 10. The individual electrodes 35 are electrically connected to the driver IC 80 through the land portions 36 and the FPC 50 including independent lead wires in accordance with the individual electrodes 35 so that electric potential of each individual electrode 35 can be controlled in accordance with a corresponding pressure chamber 10 opposite to the individual electrode 35 (see FIGS. 1 and 2).

A C-shaped groove portion (cavity) 61 is formed on the outer circumference of each land portion 36 so as to be arranged along the outer shape of the land portion 36 except the connection region 35a of the individual electrode 35 in plan view and cross virtual lines 62 connecting the land portion 36 to adjacent individual electrodes 35 respectively at the shortest distance. As a result, the land portions 36 as a cause of structural crosstalk are perfectly covered with the C-shaped groove portions 61 respectively. As shown in FIGS. 9A and 9B, each groove portion 61 has a U-shaped sectional shape having a width of about 30 µm and a depth of about 15 µm. Each groove portion 61 pierces the piezoelectric sheet 41 so that the bottom of the groove portion 61 reaches the position of the common electrode 34. Incidentally, the groove portions 61 are formed by laser machining using a YAG laser or the like.

Next, a drive method of the actuator unit 21 will be described. The direction of polarization of the piezoelectric sheet 41 in the actuator unit 21 is a direction of the thickness of the piezoelectric sheet 41. That is, the actuator unit 21 has a so-called unimorph type structure in which one piezoelectric sheet 41 on an upper side (i.e., far from the pressure chambers 10) is used as a layer including an active layer while three piezoelectric sheets 42 to 44 on a lower side (i.e., near to the pressure chambers 10) are used as non-active layers. Accordingly, when the electric potential of an individual electrode 35 is set at a predetermined positive or negative value, an electric field applied portion of the piezoelectric sheet 41 put between electrodes serves as an active layer and shrinks in a direction perpendicular to the direction of polarization by the transverse piezoelectric effect, for example, if the direction of the electric field is the same as the direction of polarization. On the other hand, the piezoelectric sheets 42 to 44 are not affected by the electric field, so that the piezoelectric sheets 42 to 44 do not shrink spontaneously. Accordingly, a difference in distortion in a direction perpendicular to the direction of polarization is generated between the piezoelectric sheet 41 on the upper side and the piezoelectric sheets 42 to 44 on the lower side, so that the whole of the piezoelectric sheets 41 to 44 is to be deformed so as to be curved convexly on the non-active side (unimorph deformation). On this occasion, as shown in FIGS. 9A and 9B, the lower surface of the whole of the piezoelectric sheets 41 to 44 is fixed to the upper surface of the cavity plate 22 which partitions the pressure chambers. As a result, the piezoelectric sheets 41 to 44 are deformed so as to be curved convexly on the pressure chamber side. For this reason, the volume of the pressure chamber 10 is reduced to increase the pressure of ink to thereby eject ink from a nozzle 8 connected to the pressure chamber 10. Then, when the electric potential of the individual electrode 35 is returned to the same value as the electric potential of the common electrode 34, the piezoelectric sheets 41 to 44 are restored to the original shape so that the volume of the pressure chamber 10 is returned to the original value. As a result, ink is sucked from the manifold 5 side.

Incidentally, another drive method may be used as follows. The electric potential of each individual electrode 35 is set at a value different from the electric potential of the common electrode 34 in advance. Whenever there is an ejection request, the electric potential of the individual electrode 35 is once changed to the same value as the electric potential of the common electrode 34. Then, the electric potential of the individual electrode 35 is returned to the original value different from the electric potential of the common electrode 34 at predetermined timing. In this case, the piezoelectric sheets 41 to 44 are restored to the original shape at the timing when the electric potential of the individual electrode 35 becomes equal to the electric potential of the common electrode 34. Accordingly, the volume of the pressure chamber 10 is increased compared with the initial state (in which the common electrode 34 and the individual electrode 35 are different in electric potential from each other), so that ink is sucked from the manifold 5 side into the pressure chamber 10. Then, the piezoelectric sheets 41 to 44 are deformed so as to be curved convexly on the pressure chamber 10 side at the timing when the electric potential of the individual electrode 35 is set at the original value different from the electric potential of the common electrode 34 again. As a result, the volume of the pressure chamber 10 is reduced to increase the pressure of ink to thereby eject ink.

If the direction of the electric field applied on the piezoelectric sheet 41 is reverse to the direction of polarization of the piezoelectric sheet 41, the active layer in the piezoelectric sheet 41 put between the common electrode 34 and the individual electrode 35 is to expand in a direction perpendicular to the direction of polarization by the transverse piezoelectric effect. Accordingly, the piezoelectric sheets 41 to 44 are deformed so as to be curved concavely on the pressure chamber 10 side. For this reason, the volume of the pressure chamber 10 is increased so that ink is sucked from the manifold 5 side. Then, when the electric potential of the individual electrode 35 is returned to the original value, the piezoelectric sheets 41 to 44 are restored to the original planar shape. As a result, the volume of the pressure chamber 10 is returned to the original value, so that ink is ejected from the nozzle 8 connected to the pressure chamber 10.

As described above, the inkjet head 1 according to the first embodiment is configured so that the non-active layer side of the actuator unit 21 opposite to the locations of the land portions 36 is fixed to the upper surface of the partition wall 22 for forming the pressure chambers while only the piezoelectric sheet 41 as the uppermost layer includes an active layer capable of being deformed spontaneously by the piezoelectric effect. When a voltage is applied to a land portion 36, the active layer just under the land portion 36 shrinks in a direction perpendicular to the direction of polarization on the basis of the transverse piezoelectric effect if the direction of the electric field is the same as the direction of polarization like the case where a voltage is applied to an individual electrode 35. On this occasion, the piezoelectric sheet 44 as one of non-active layers of the piezoelectric sheets just under the land portion 36 is fixed to the upper surface of the partition wall 22 for forming the pressure chambers 10. Accordingly, the deformation of the piezoelectric sheet 44 in accordance with the deformation of the active layer just under the land portion 36 is restricted, so that the position of deformation approaching the piezoelectric sheet 44 serving as a non-active layer from the piezoelectric sheet 41 serving as an active layer can be hardly displaced. Conversely, the shrinking displacement of the active layer capable of being deformed freely results in stretching a region of the piezoelectric sheet 41 mainly including the active layer and adjacent to the land portion 36 in accordance with the amount of displacement. If there is a pressure chamber 10 corresponding to the stretched region, the piezoelectric sheet 41 as the uppermost layer of the piezoelectric sheets provided in accordance with the pressure chamber 10 is not spontaneously deformed but gets into a state in which the piezoelectric sheet 41 is stretched in a planar direction. On the other hand, the piezoelectric sheet 44 located just above the pressure chamber 10 is a non-active layer originally, so that the deformation at adjacent land portions 36 is little transmitted to the piezoelectric sheet 44 structurally. For this reason, unimorph type deformation occurs in the whole of the piezoelectric sheets 41 to 44 corresponding to the pressure chamber 10 so that the whole of the piezoelectric sheets 41 to 44 is deformed so as to be curved concavely on the pressure chamber 10 side. That is, the deformation of the active layer caused by the application of a voltage to a land portion 36 is to be transmitted to adjacent regions directly. However, because each groove portion 61 is formed along the outer shape of a corresponding land portion 36, the amount of deformation of a portion of the piezoelectric sheet 41 opposite to another adjacent pressure chamber 10 becomes small even in the case where a portion of the active layer opposite to the land portion 36 is deformed. That is, even in the case where pressure chambers 10 are arranged densely, it is possible to reduce so-called structural crosstalk in which ink is ejected from nozzles originally unnecessary for ink ejection or the amount of ejected ink increases or decreases from the original value.

Moreover, because each grove portion 61 is formed along the outer shape of a corresponding land portion 36, the distance of the formed groove portion 61 is shortened so that reduction in rigidity of the actuator unit 21 can be suppressed. Moreover, because the time required for using the laser for forming the groove portions 61 can be shortened, reduction in cost for forming the groove portions 61 can be attained.

Moreover, because the groove portions 61 are formed so as to pierce the piezoelectric sheet 41 which serves as an active layer to bring the largest displacement compared with the other piezoelectric sheets, structural crosstalk can be reduced effectively.

In addition, because each groove portion 61 is formed continuously on the nearly whole circumference of the land portion 36 except the connection region for connecting the individual electrode 35 and the land portion 36 to each other, structural crosstalk can be reduced in almost all directions of the land portion 36.

Next, an inkjet head according to a second embodiment of the invention will be described. The inkjet head according to the second embodiment is different from that according to the first embodiment only in the position and shape of each groove portion formed in the actuator unit. Therefore, in the drawing showing the second embodiment, parts the same as those in the first embodiment are denoted by reference numerals the same as those in the first embodiment for the sake of omission of duplicated description.

Figure 10:
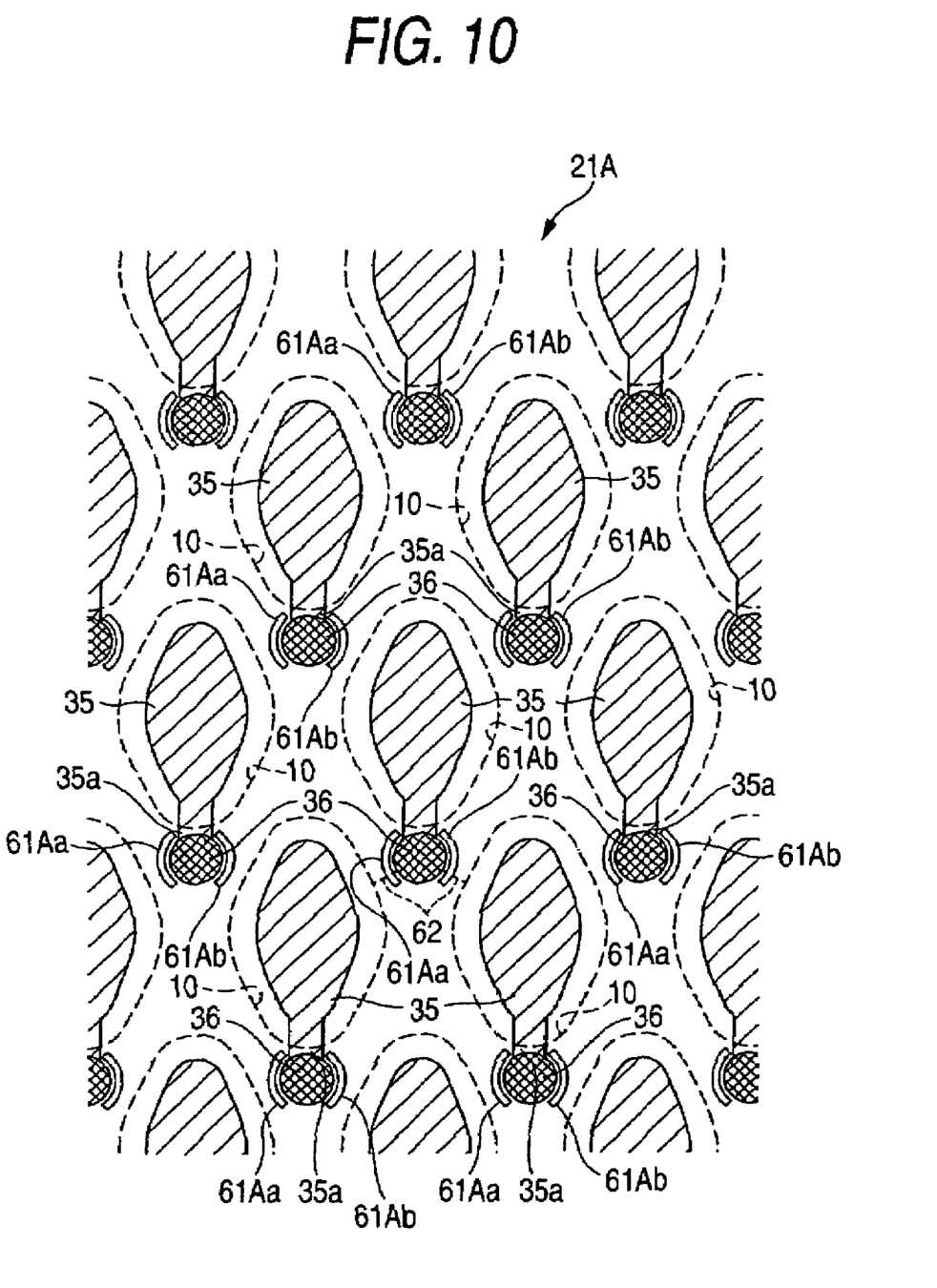
FIG. 10 is an enlarged plan view of an actuator unit in a second embodiment of the invention.

FIG. 10 is an enlarged plan view of an actuator unit 21A in the inkjet head according to the second embodiment of the invention.

As shown in FIG. 10, each individual electrode 35 has an early rhomboid (parallelogrammatic) planar shape (electrode region) having a thickness of about 1 µm and nearly similar to the shape of the pressure camber 10. The individual electrodes 35 are arranged in the form of a matrix (see FIG. 5). One of acute-angled portions of each nearly rhomboid individual electrode 35 extends in a direction (downward in FIG. 10). A circular land portion 36 (terminal region) having a diameter of about 160 .m is provided at an end of the extension so as to be electrically connected to the individual electrode 35. Each individual electrode 35 further has a connection region 35a disposed between the electrode region and the terminal region and provided as a region not opposite to the pressure chamber 10. Two C-shaped groove portions (cavities) 61Aa and 61Ab are formed on the outer circumference of each land portion 36 so that the land portion 36 is sandwiched between the two C-shaped groove portions 61Aa and 61Ab in plan view and that the two C-shaped groove portions 61Aa and 61Ab are disposed along the outer shape of the land portion 36 and in regions of from opposite sides of the connection region of the individual electrode 35 to neighbors of a portion of the terminal region opposite to the connection region. The groove portions 61Aa and 61Ab are formed in positions crossing virtual lines 62 connecting the land portion 36 to adjacent individual electrodes 35 respectively at the shortest distance. The groove portions 61Aa and 61Ab are symmetrical to each other with respect to a line passing through the two acute-angled portions of the individual electrode 35. In a section of the actuator unit 21A, each of the groove portions 61Aa and 61Ab has a U-shaped sectional shape having a width of about 30 µm and a depth of about 15 µm. The groove portions 61Aa and 61Ab pierce the piezoelectric sheet 41 so that the bottom of each groove portion reaches the position of the common electrode 34. The bottom of each groove portion may not reach the position of the common electrode 34, but when the bottom reaches deeper and deeper, the structural crosstalk can be decreased more effectively.

As described above, in accordance with the second embodiment, structural crosstalk can be reduced efficiently because the groove portions 61Aa and 61Ab are formed in accordance with the virtual lines 62 along which structural crosstalk generated from a land portion 36 is most intensively transmitted to adjacent pressure chambers 10. Moreover, because the distance of each of the groove portions 61Aa and 61Ab can be shortened, reduction in rigidity of the actuator unit 21A can be suppressed. Moreover, because the time required for using the laser for forming the groove portions 61Aa and 61Ab can be shortened, reduction in cost for forming the groove portions 61Aa and 61Ab can be attained.

Next, an inkjet head according to a third embodiment of the invention will be described. The inkjet head according to the third embodiment is different from that according to the first embodiment only in the position and shape of each groove portion formed in the actuator unit. Therefore, in the drawing showing the third embodiment, parts the same as those in the first embodiment are denoted by reference numerals the same as those in the first embodiment for the sake of omission of duplicated description.

Figure 11:
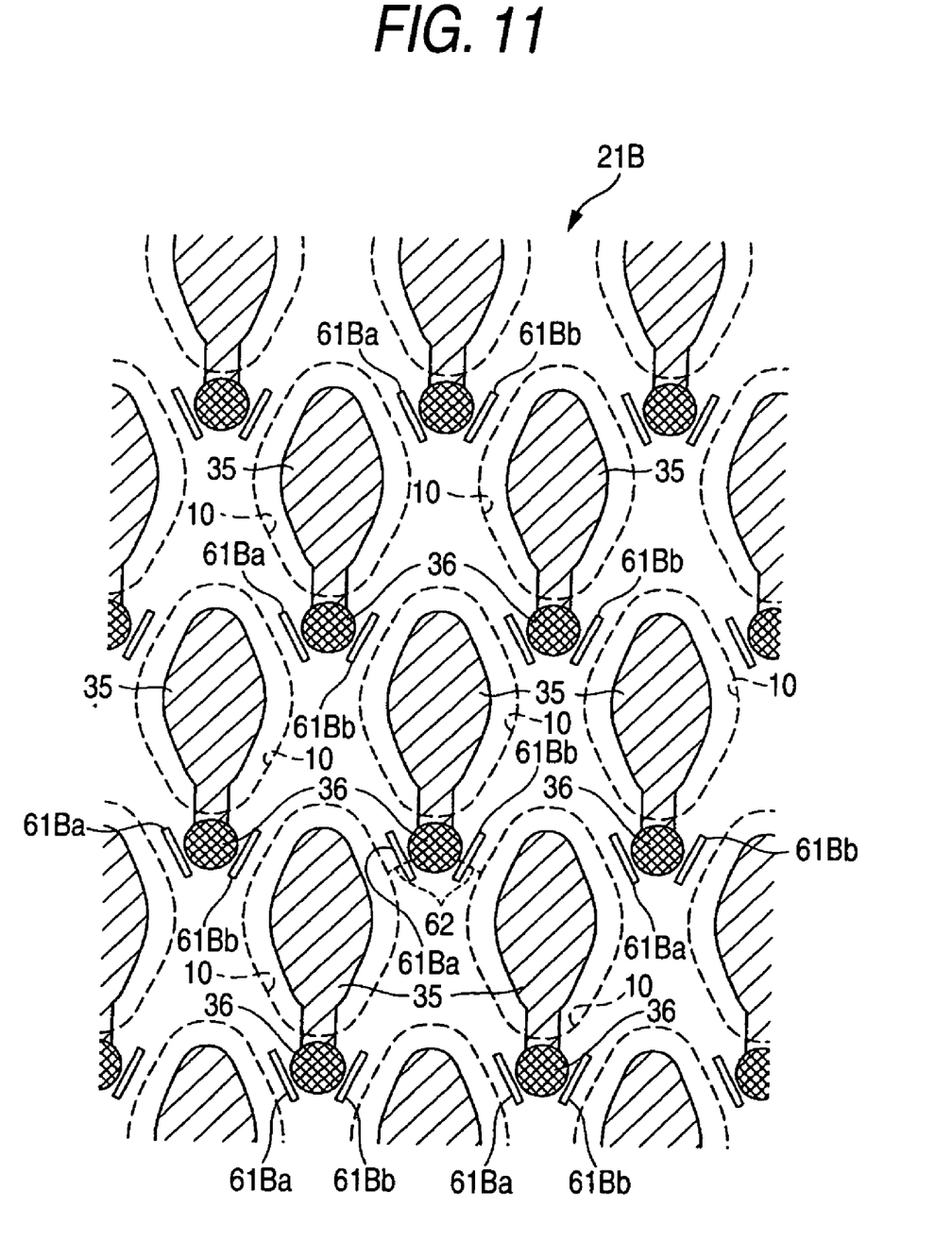
FIG. 11 is an enlarged plan view of an actuator unit in a third embodiment of the invention.

FIG. 11 is an enlarged plan view of an actuator unit 21B in the inkjet head according to the third embodiment of the invention.

As shown in FIG. 11, each individual electrode 35 has an early rhomboid (parallelogrammatic) planar shape (electrode region) having a thickness of about 1 μm and nearly similar to the shape of the pressure camber 10. The individual electrodes 35 are arranged in the form of a matrix (see FIG. 5). One of acute-angled portions of each nearly rhomboid individual electrode 35 extends in a direction (downward in FIG. 11). A circular land portion 36 (terminal region) having a diameter of about 160 μm is provided at an end of the extension so as to be electrically connected to the individual electrode 35. Each individual electrode 35 further has a connection region 35a disposed between the electrode region and the terminal region and provided as a region not opposite to the pressure chamber 10. Two linear groove portions (cavities) 61Ba and 61Bb are formed on the outer circumference of each land portion 36 so that the land portion 36 is sandwiched between the two linear groove portions 61Ba and 61Bb in plan view. The groove portions 61Ba and 61Bb are formed so that the groove portions 61Ba and 61Bb perpendicularly cross virtual lines 62 connecting the land portion 36 to adjacent individual electrodes 35 respectively at the shortest distance and are symmetrical to each other with respect to a line passing through the two acute-angled portions of the individual electrode 35. In a section of the actuator unit 21B, each of the groove portions 61Ba and 61Bb has a U-shaped sectional shape having a width of about 30 .m and a depth of about 15 μm. The groove portions 61Ba and 61Bb pierce the piezoelectric sheet 41 so that the bottom of each groove portion reaches the position of the common electrode 34.

As described above, in accordance with the third embodiment, structural crosstalk can be reduced efficiently because the groove portions 61Ba and 61Bb are formed in accordance with the virtual lines 62 along which structural crosstalk generated from a land portion 36 is most intensively transmitted to adjacent pressure chambers 10. Moreover, because the distance of each of the groove portions 61Ba and 61Bb can be shortened, reduction in rigidity of the actuator unit 21B can be suppressed. Moreover, because the time required for using the laser for forming the groove portions 61Ba and 61Bb can be shortened, reduction in cost for forming the groove portions 61Ba and 61Bb can be attained.

Although preferred embodiments of the invention have been described above, the invention is not limited to the embodiments and various changes may be made on design without departing from the scope of claim. For example, in each of the first to third embodiments, the materials for the piezoelectric sheets and electrodes are not limited to the aforementioned materials but may be replaced by other known materials. The planar shape of each pressure chamber, the sectional shape of each pressure chamber, the form of arrangement of the pressure chambers, the number of piezoelectric sheets including an active layer, the number of non-active layers, and soon, may be changed suitably. For example, only one actuator unit formed so as to be long and narrow may be bonded to the flow path unit. The layer thickness of the piezoelectric sheet including the active layer may be set to be different from the layer thickness of each non-active layer.

Although the first to third embodiments have been described on the case where the groove portions 61, 61Aa, 61Ab, 61Ba and 61Bb are formed only on the outer circumferences of the land portions 36, the groove portions may be formed so as to go beyond the outer circumferences of the land portions 36.

Although the first to third embodiments have been described on the case where the groove portions 61, 61Aa, 61Ab, 61Ba and 61Bb are formed so as to pierce only the piezoelectric sheet 41, the groove portions may be formed in such a manner that at least one part of the piezoelectric sheet 41 is cut away or in such a manner that the groove portions pierce not only the piezoelectric sheet 41 but also the common electrode 34 and the piezoelectric sheets 42 to 44 so as to reach any position. When a plurality of active layers are formed in the actuator unit, the groove portions may be formed in such a manner that the groove portions reach any position of an active layer or in such a manner that the groove portions pierce the plurality of active layers.

Although the second and third embodiments have been described on the case where two groove portions 61Aa and 61Ab (or 61Ba and 61Bb) are formed around each and portion 36, three or more groove portions may be formed around each land portion 36.

Although the first to third embodiments have been described on the case where the groove portions 61, 61Aa, 61Ab, 61Ba and 61Bb are formed in positions crossing the virtual lines 62 connecting the land portions 36 to adjacent individual electrodes 35 respectively at the shortest distance, the groove portions may be formed in positions not crossing the virtual lines 62.

Although the first and second embodiments have been described on the case where the groove portions 61, 61Aa and 61Ab are not formed in positions opposite to the connection regions 35a of the individual electrodes 35, the groove portions may be formed so as to reach the positions opposite to the connection regions 35a.

What is claimed is:

1. An inkjet head comprising:
   a flow path unit including pressure chambers arranged adjacently to one another in a form of a matrix along a plane and connected to nozzles respectively; and
   an actuator unit fixed to a surface of the flow path unit which changes a volume of each of the pressure chambers, wherein the actuator unit includes:
   individual electrodes having electrode regions arranged in positions opposite to the pressure chambers respectively, and terminal regions which are connected to the electrode regions and to which signal lines are connected;
   a common electrode provided so as to be laid over the pressure chambers;
   at least one piezoelectric sheet put between the common electrode and the individual electrodes; and
   grooves formed around the terminal regions respectively.

2. An inkjet head according to claim 1, wherein the grooves are provided only around the terminal regions.

3. An inkjet head according to claim 1, wherein
   each of the pressure chambers is shaped like a parallelogram having two acute-angled portions or like a parallelogram having rounded corner portions in plan view so that corresponding one of the terminal regions is located near one of the two acute-angled portions of the pressure chamber and between the electrode regions of other two adjacent individual electrodes.

4. An inkjet head according to claim 1, wherein
   the grooves are formed so as to pierce the at least one piezoelectric sheet put between the common electrode and the individual electrodes.

5. An inkjet head according to claim 1, wherein
   the grooves are formed along outer shapes of the terminal regions respectively.

6. An inkjet head according to claim 5, wherein:
the individual electrodes further have connection regions which connects the electrode regions to the terminal regions respectively; and
the grooves are formed continuously on the nearly whole circumferences of the terminal regions except portions facing the connection regions respectively.

7. An inkjet head according to claim 5, wherein
the grooves are provided so that a plurality of grooves is formed around each terminal region.

8. An inkjet head according to claim 7, wherein
the grooves are provided so that two of the grooves are formed around the terminal region of a corresponding individual electrode so as to be symmetrical to each other with respect to a line connecting the electrode region and the terminal region of the corresponding individual electrode to each other.

9. An inkjet head according to claim 1, wherein
the grooves are formed in positions crossing virtual lines connecting the terminal regions of the individual electrodes to the electrode regions of adjacent individual electrodes respectively at the shortest distance.

10. An inkjet head according to claim 1, wherein
the terminal region of each individual electrode is disposed opposite to girder portions serving as partition walls for forming adjacent pressure chambers.

11. An inkjet head according to claim 1, wherein
the grooves are formed into the at least one piezoelectric sheet.

* * * * *